(12) United States Patent
Nakata

(10) Patent No.: US 7,947,894 B2
(45) Date of Patent: May 24, 2011

(54) LIGHT RECEIVING OR LIGHT EMITTING SEMICONDUCTOR MODULE

(75) Inventor: Josuke Nakata, Kyoto (JP)

(73) Assignee: Kyosemi Corporation, Kyotyo (JP)

( * ) Notice: Subject to any disclaimer, the term of this patent is extended or adjusted under 35 U.S.C. 154(b) by 526 days.

(21) Appl. No.: 12/223,481

(22) PCT Filed: Feb. 6, 2006

(86) PCT No.: PCT/JP2006/301990
§ 371 (c)(1),
(2), (4) Date: Jul. 31, 2008

(87) PCT Pub. No.: WO2007/091294
PCT Pub. Date: Aug. 16, 2007

(65) Prior Publication Data
US 2009/0025780 A1  Jan. 29, 2009

(51) Int. Cl.
*H01L 31/042* (2006.01)
*H01L 33/00* (2010.01)

(52) U.S. Cl. .......... 136/250; 136/246; 136/251; 257/93; 257/773; 257/91; 257/E33.006

(58) Field of Classification Search ............... 257/88, 257/773, 91; 136/250
See application file for complete search history.

(56) References Cited

U.S. PATENT DOCUMENTS

| | | | | |
|---|---|---|---|---|
| 4,126,812 A | * | 11/1978 | Wakefield | 313/500 |
| 6,294,822 B1 | | 9/2001 | Nakata | |
| 6,706,959 B2 | * | 3/2004 | Hamakawa et al. | 136/250 |
| 6,744,073 B1 | | 6/2004 | Nakata | |
| 7,205,626 B1 | | 4/2007 | Nakata | |
| 7,394,016 B2 | * | 7/2008 | Gronet | 136/246 |
| 7,602,035 B2 | * | 10/2009 | Nakata | 257/456 |
| 2002/0096206 A1 | | 7/2002 | Hamakawa et al. | |
| 2004/0238833 A1 | | 12/2004 | Nakata | |
| 2005/0127379 A1 | | 6/2005 | Nakata | |

FOREIGN PATENT DOCUMENTS

| | | |
|---|---|---|
| JP | 2001/168369 | 6/2001 |
| JP | 2001/267609 | 9/2001 |
| JP | 2002-164554 | 6/2002 |
| WO | WO-98/15983 | 4/1998 |
| WO | WO-99/10935 | 3/1999 |
| WO | WO-02/35612 | 5/2002 |
| WO | WO-02/35613 | 5/2002 |
| WO | WO-03/017382 | 2/2003 |
| WO | WO-03/036731 | 5/2003 |

* cited by examiner

*Primary Examiner* — Joseph S Del Sole
*Assistant Examiner* — Marla D McConnell
(74) *Attorney, Agent, or Firm* — Jordan and Hamburg LLP

(57) ABSTRACT

In the solar battery module 20, solar battery cells 10 arranged in a matrix of eight rows and four columns with their conducting direction aligned and five plate spring members 22 having nearly an inverted U-shaped cross-section are housed in an inner space surrounded by a support substrate 21, an outer frame, a rubber packing frame, and a glass casing plate 25, and the plate spring members 22 each have a pair of connection flanges 22*a* at the bottom. The plate spring members 22 are provided on either side of columns of multiple solar battery cells 10. Eight solar battery cells 10 are interposed between the connection flanges 22*a* of the plate spring members on either side of them, whereby they are parallel-connected. Four columns of solar battery cells 10 are serially-connected by five plate spring members 22 and the output is retrieved through the positive electrode coating 28 and negative electrode coating 29.

13 Claims, 8 Drawing Sheets

LIGHT RECEIVING OR LIGHT EMITTING SEMICONDUCTOR MODULE

TECHNICAL FIELD

The present invention relates to a light receiving or light emitting semiconductor module in which multiple spherical semiconductor elements having light receiving or light emitting capability are electrically connected in series and in parallel for high output.

BACKGROUND TECHNOLOGY

The inventor of the present invention has proposed a spherical semiconductor element having light receiving or light emitting capability that has positive and negative electrodes at opposite positions about the center thereof, and a solar battery module wherein multiple sets of multiple semiconductor elements are serially connected in each set and the multiple semiconductor elements are embedded in a synthetic resin material as set forth in the publication of WO98/15983. In the solar battery module, the semiconductor elements have a spherical form and a spherical pn-junction in the surface part. The positive and negative electrodes are provided in the centers of the surfaces of the p-type and n-type regions forming the pn-junction.

The inventor of the present invention has proposed a solar battery module wherein the above spherical semiconductor elements are arranged in multiple rows and multiple columns, the semiconductor elements in each row are connected in parallel by conductive members and solder or conductive adhesive, the semiconductor elements in each column are serially connected by lead members and solder, and they are embedded in a synthetic resin material as set forth in the publication of WO02/35612, WO02/35613, and WO03/017382.

The inventor of the present invention has further proposed a semiconductor module having light receiving or light emitting capability wherein multiple semiconductor elements are embedded in a synthetic resin material as set forth in the publication of WO03/036731.

Recently, solar batteries have come to be increasingly used as a renewable clean energy source in regard to environmental issues such as air pollution and global warming and exhaustion of fossil fuels. Light emitting diodes are also increasingly in use as illumination source from the viewpoint of energy and resource saving. There is also an increasing need of saving resources for materials and reducing production energy consumption.

Patent Document 1: WO98/15983;
Patent Document 2: WO02/35612;
Patent Document 3: WO02/35613;
Patent Document 4: WO03/017382; and
Patent Document 5: WO03/036731.

DISCLOSURE OF THE INVENTION

Problems to be Solved by the Invention

In the prior art solar battery module or light emitting diode display, a number of granular semiconductor elements are connected to conductive members by solder or conductive adhesive and they are embedded in a synthetic resin cover casing (outer enclosure) to form a module. Therefore, a number of semiconductor elements cannot be separated from the cover casing for recovering them upon disposal of the solar battery module. For this reason, it is difficult to recover semiconductor elements from solar battery modules or light emitting diode displays and reuse them. A resolution taking into account resources and the natural environment is required.

When, as described, a large number of semiconductor elements come into practical use in the near future, their replacement and disposal will accordingly increase as a result of deterioration and expiration of life-span, with an accompanying increase in the load on resources and the natural environment. Particularly, restriction has been imposed on the use of lead-containing solder materials in them.

The purpose of the present invention is to provide a light receiving or light emitting semiconductor module that is applicable to solar battery modules and light emitting modules in which multiple granular light receiving or light emitting semiconductor elements are installed and that facilitates reuse, reproduction, and repair of multiple semiconductor elements.

Problem Resolution Means

The light receiving or light emitting semiconductor module of the present invention is a semiconductor module having light receiving or light emitting capability characterized by comprising a support substrate, multiple granular semiconductor elements having light receiving or light emitting capability and arranged in multiple columns on the support substrate with their conducting direction aligned orthogonally to the column direction, multiple metal plate spring members in the form of nearly an inverted U-shaped cross-section trough having light reflection and conduction capabilities and provided in parallel in the manner that multiple semiconductor elements in each column are interposed between the free ends of adjacent plate spring members, and a conductive connection mechanism in parallel connecting multiple semiconductor elements in each column via multiple plate spring members and serially connecting multiple semiconductor elements in multiple columns via multiple plate spring members.

Advantages Of The Invention

A support substrate, multiple granular semiconductor elements having light receiving or light emitting capability and arranged in multiple columns on the support substrate with their conducting direction aligned orthogonally to the column direction, and multiple metal plate spring members in the form of nearly an inverted U-shaped cross-section trough having light reflection and conduction capabilities are provided. The multiple plate spring members are provided in parallel in the manner that multiple semiconductor elements in each column are interposed between the free ends of adjacent plate spring members. A conductive connection mechanism connecting in parallel multiple semiconductor elements in each column via multiple plate spring members and serially connecting multiple semiconductor elements in multiple columns via multiple plate spring members is provided. Then, the following advantages can be obtained.

The multiple plate spring members hold semiconductor elements in desired positions. The conductive connection mechanism effectively using multiple plate spring members connects in parallel multiple semiconductor elements in each column and serially connects multiple semiconductor elements in multiple columns. Then, the structure for positioning and holding multiple semiconductor elements and the structure for connecting multiple semiconductor elements in series and in parallel can significantly be simplified.

The conductive connection mechanism does not need solder or conductive adhesive, reducing semiconductor module production facility and cost. For disassembling used semiconductor modules, multiple plate spring members are disintegrated, whereby the semiconductor elements can be recovered with no damage. Semiconductors and plate spring members can be recovered for reuse. The plate spring members have a large surface area for their volume, having a high heat dissipation capacity. Therefore, the temperature within the light receiving or light emitting module does not go up so much and the photoelectric or electrophoto conversion efficiency does not go down so much, making the light receiving or light emitting module more durable.

Figure 1:
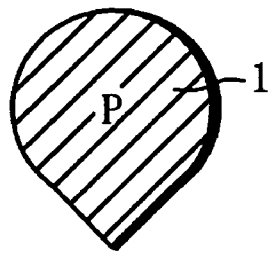
FIG. 1 is a cross-sectional view of a solidified silicon crystal relating to an embodiment of the present invention.

EXPLANATION ON NUMERALS 5 positive electrode
6 negative electrode
10 solar battery cell
20 solar battery module
21 support substrate
22 plate spring member
22a connection flange
23 outer frame
24 rubber packing frame
25 casing plate
25a convex lens part
25b concave engaging part
26 conductive connection mechanism
27 recess
28 positive electrode coating
29 negative electrode coating
30a, 30b, 30c electrode coating
34 elastic member

BEST MODE FOR IMPLEMENTING THE INVENTION

The present invention relates to a light receiving or light emitting semiconductor module comprising multiple granular semiconductor elements having light receiving or light emitting capability wherein multiple semiconductor elements are individually separable for disposal or repair of the semiconductor module.

Embodiment 1

The solar battery module (light receiving semiconductor module) according to an embodiment will be described hereafter. The structure and production method of a spherical silicon solar battery cell (semiconductor element) will be described with reference to FIGS. 1 to 7. The structure and production method of this spherical silicon solar battery cell is disclosed in the publication of WO03/017382 by the inventor of the present invention and therefore briefly explained here.

FIG. 1 is a cross-sectional view of a p-type spherical silicon crystal 1 (monocrystal or polycrystal) having a diameter of 1.0 to 2.0 mm. The granular silicon crystal 1 is produced by melting a silicon row material in a crucible at the top of a drop tube, discharging silicon droplets from the nozzle orifice of the crucible, and allowing them to free-fall in the drop tube having a height of approximately 14 m. The droplets shaped into a sphere due to surface tension during the fall are cooled and solidified into spherical crystal and recovered at the bottom of the drop tube. The silicon crystal 1 of this embodiment is monocrystalline silicon. Those solidified at the end of solidifying process may have a projection as shown in FIG. 1. The projection is removed and polished to a sphere.

Figure 2:
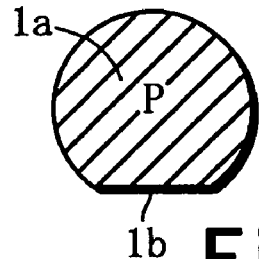
FIG. 2 is a cross-sectional view of a silicon crystal from which the projection is cut away.
Figure 3:
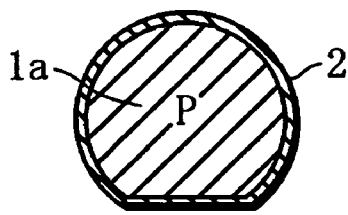
FIG. 3 is a cross-sectional view of a silicon crystal on which a silicon oxide film is formed.
Figure 4:
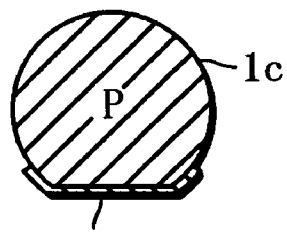
FIG. 4 is a cross-sectional view of a silicon crystal from which the silicon oxide film is partly removed.

As shown in FIG. 2, the surface of the spherical silicon crystal 1 is polished and partly flattened to form a reference surface 1b, whereby a silicon crystal 1a is obtained. The silicon crystal 1a has a diameter of approximately 1.8 mm. Then, as shown in FIG. 3, a silicon oxide film 2 is formed on the entire surface of the silicon crystal 1a by a known thermal oxidation technique. Then, as shown in FIG. 4, the silicon oxide film 2 is removed except for a silicon oxide film 2a on the reference surface 1b and its vicinity. The silicon oxide film 2a is used as a mask in the subsequent impurity diffusion. It is a known technique to leave such a silicon oxide film in part as a mask.

Figure 5:
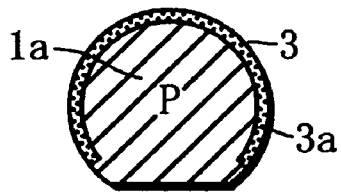
FIG. 5 is a cross-sectional view of a silicon crystal on which an n-type diffused layer and a pn-junction are formed.
Figure 6:
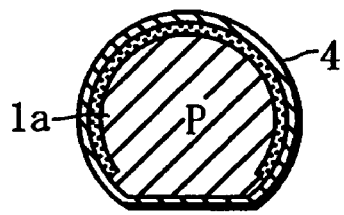
FIG. 6 is a cross-sectional view of a silicon crystal on which a silicon oxide coating is formed.

As shown in FIGS. 4 and 5, an n-type impurity is thermally diffused through the exposed p-type surface 1c into the surface part by a known thermal diffusion technique using the silicon oxide film 2a as a mask to form an n-type layer 3, thereby forming a nearly spherical pn-junction 3a. Then, the nearly spherical pn-junction 3a is formed except for the reference surface 1b and its vicinity. The silicon oxide film incidentally generated during the thermal diffusion of n-type impurity is once removed by a known chemical etching. Then, the silicon crystal 1a is again heated in an oxygen-containing atmosphere to form on the entire surface a silicon oxide film 4 to a predetermined thickness as shown in FIG. 6. The silicon oxide film 4 serves as an antireflection coating.

Figure 7:
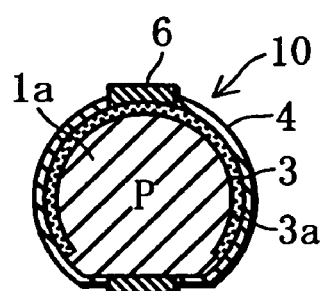
FIG. 7 is a cross-sectional view of a solar battery cell.

Then, a silver-based paste is printed in dots on the flat reference surface 1b (p-type) and on the top (n-type) of the silicon crystal at the opposite position to the reference surface 1b about the center of the silicon crystal 1a and processed at a high temperature for a short time. Consequently, as shown in FIG. 7, the paste penetrates the silicon oxide film 4 and makes ohmic contact with the p-type silicon reference surface 1b and the surface of the n-type layer 3 to form a positive electrode 5 and a negative electrode 6, respectively, whereby a solar battery cell 10 is obtained. The positive and negative electrodes 5 and 6 are at opposite positions about the center of the silicon crystal 1a. The center of the silicon crystal 1a is on the line connecting the centers of the positive and negative electrodes 5 and 6.

The granular and spherical solar battery cell 10 as prepared above has a spherical pn-junction 3a at a uniform depth below the surface of the silicon crystal 1a and therefore photoelectrically converts incident light in any direction at a nearly equal light receiving sensitivity. A spherical light emitting diode having such a spherical pn-junction emits uniform light from the spherical surface in any direction using the electric energy input from the positive electrode 5.

A solar battery module 20 in which a number of the above described spherical solar battery cells 10 are incorporated and connected in series and in parallel will be described hereafter with reference to FIGS. 8 to 18.

As shown in FIGS. 8 to 12, the solar battery module 20 comprises a support substrate 21 provided on the under side, a number of solar battery cells 10 arranged in four columns on the support substrate 21, five plate spring members 22 provided in parallel to the four columns, an outer frame 23, a rubber packing frame 24, a light transmissible casing plate 25 on the upper side, a conductive connection mechanism 26 connecting in parallel multiple (for example eight) solar battery cells 10 in each column and connecting in series multiple (for example 32) solar battery cells 10 in multiple columns (for example four), and multiple bolts and nuts 39.

Figure 8:
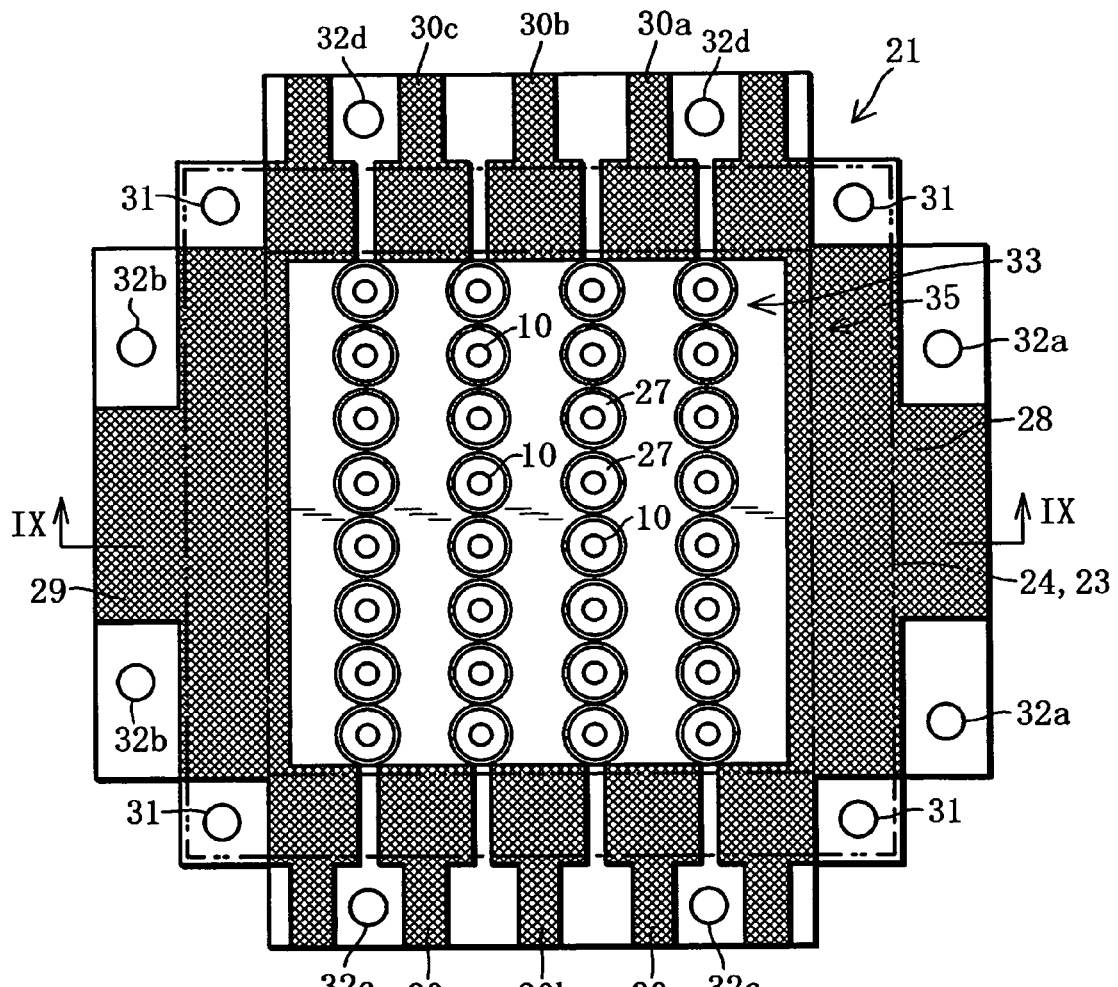
FIG. 8 is a plan view of the support substrate of the solar battery module according to an embodiment.
Figure 9:
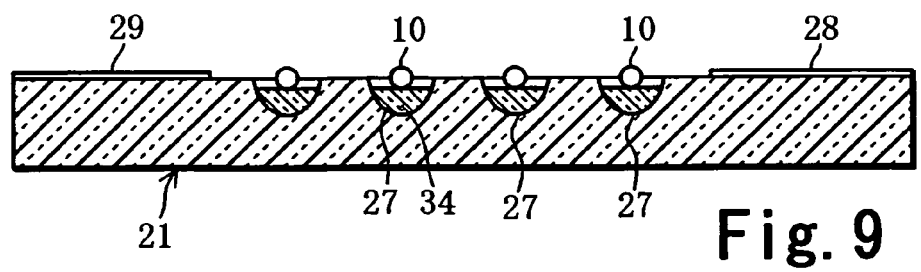
FIG. 9 is a cross-sectional view at the line IX-IX in FIG. 8.

FIG. 8 shows the support substrate 21, thirty two solar battery cells 10 arranged in a matrix of eight rows and four columns on the support substrate 21, recesses 27 arranged in a matrix of eight rows and four columns, positive and negative electrode coatings 28 and 29 and multiple electrode coatings 30a to 30c formed on the surface of the outer periphery of the support substrate 21, assembly bolt holes 31, and bolt holes 32a to 32d for connection to conductive connection plates (not shown). FIG. 9 is a cross-sectional view at the line IX-IX in FIG. 8.

The conducting direction of the thirty two solar battery cells 10 is aligned orthogonally to the column direction. In FIG. 8, the solar battery cells 10 each have a positive electrode 5 on the right side in the center and a negative electrode 6 on the left side in the center (see FIGS. 14 and 15). The solar battery module 20 of this embodiment has solar battery cells 10 arranged in a matrix of eight rows and four columns for convenience of explanation. In practice, it is constituted by solar battery cells 10 arranged in a matrix of several tens or several hundreds rows and several tens or several hundreds columns.

The support substrate 21 is a white ceramic substrate having a thickness of approximately 5 mm. It can be a synthetic resin or reinforced glass support substrate. The support substrate 21 has in the center a cell setup zone 33 where thirty two recesses 27 are arranged in a matrix of eight rows and four columns corresponding to the solar battery cells 10 arranged in a matrix of eight rows and four columns. The recesses 27 are formed by sandblasting or metal-molding. The recesses 27 have a nearly semispherical inner surface of revolution (such as paraboloid of revolution or ellipsoid of revolution) to reflect as much light as possible toward the solar battery cells 10. The recesses 27 each have a high-reflectance silver reflecting film 27a on the inner surface.

The recesses 27 are filled with an elastic member 34 (filler) consisting of a low adhesive, flexible, and elastic transparent synthetic resin (for example silicone rubber). The elastic member 34 has the top surface below the top surface of the support substrate 21 by a distance equal to the radius of the solar battery cells 10. The positive and negative electrodes 5 and 6 of solar battery cells 10 are exposed near the top surface of the support substrate 21. The thirty two solar battery cells 10 are each slightly pressed against the surface of the elastic member 34 and their position is secured by the adhesion of the elastic member 34.

Silver-plated copper printed wirings having a thickness of 0.05 to 0.1 mm are provided on the support substrate 21 in a frame zone 35 outside the cell setup zone 33. As shown in FIG. 8, positive and negative electrode coatings 28 and 29 consisting of copper printed wirings are provided in the right and left parts of the frame zone 35, respectively. Three sets of electrode coatings 30a to 30c are provided in the front and rear parts of the frame zone 35 and electrically connected to three plate spring members 22, respectively. The support substrate 21 has vertical assembly bolt holes 31 in the four corners.

The support substrate 21 has at the right and left ends in FIG. 8 serial connection bolt holes 32a and 32b for coupling conductive connection plates (not shown) to connect in series multiple solar battery modules 20 in the transversal direction via the positive or negative electrode coating 28 or 29. The support substrate 21 has at the front and rear ends in FIG. 8 parallel connection bolt holes 32c and 32d for coupling conductive connection plates (not shown) to connect in parallel multiple solar battery modules 20 in the longitudinal direction via the electrode coatings 30a to 30c.

Figure 10:
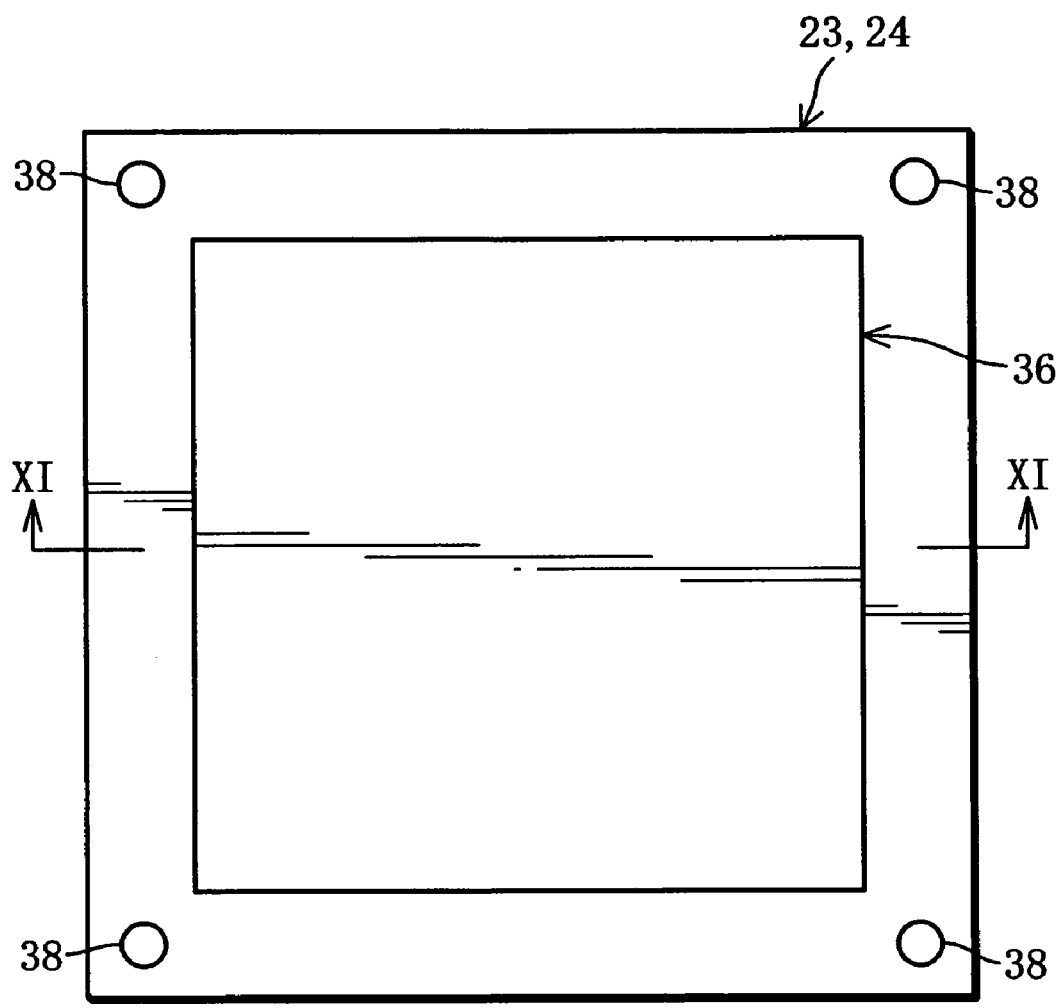
FIG. 10 is a plan view of the outer frame and rubber packing frame.
Figure 11:
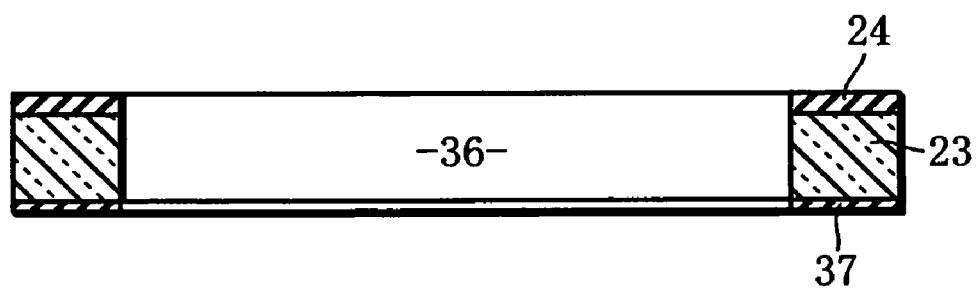
FIG. 11 is a cross-sectional view at the line XI-XI in FIG. 10.

FIGS. 10 and 11 show the outer frame 23 and rubber packing frame 24. The outer frame 23 is a square ceramic frame having a thickness of approximately 3 mm with a square opening 36 corresponding to the cell setup zone 33. The outer frame 23 has a silicone rubber, butyl rubber, or fluoro rubber coating 37 (having a thickness of approximately 0.1 to 0.2 mm) on the underside. A butyl rubber packing frame 24 having a thickness of approximately 1 mm is placed on the outer frame 23. The rubber packing frame 24 and outer frame 23 have assembly bolt holes 38 in the four corners. The rubber packing frame 24 and outer frame 23 are superimposed on the support substrate 21 and then, five plate spring members 22 are assembled in the cell setup zone 33 of the support substrate 21 as shown in FIGS. 12 to 16.

As shown in FIGS. 12 to 16, the plate spring members 22 are made of an elastic thin metal plate (for example a thin metal plate of beryllium-copper alloy) in the form of an inverted U-shaped cross-section trough. The entire surface of the plate spring members 22 is a high-reflectance light reflecting surface. The plate spring members 22 have at a pair of free bottom ends connection flanges 22a integrally formed and having an extremely narrow horizontal contact surface and an extremely narrow vertical contact surface. A light reflecting coating can be formed on the entire surface of the plate spring members 22 by plating where necessary.

The plate spring members 22 have a length larger than the longitudinal dimension of the cell setup zone 33. The plate spring members 22 stretch between the electrode coatings 30a to 30c at the front and rear ends of the cell setup zone 33.

Their front ends are connected to one of the front electrode coatings 30a to 30c and their rear ends are connected to one of the rear electrode coatings 30a to 30c.

Before assembled, the plate spring members 22 have a transversal dimension (the distance between the vertical contact surfaces of the connection flanges 22a) slightly smaller than the distance between the positive and negative electrodes 5 and 6 of two adjacent solar battery cells 10. In this way, when assembled, the plate spring members 22 do not press and dislocate the solar battery cells 10.

With thirty two solar battery cells 10 being assembled in the thirty two recesses 27 arranged in a matrix of eight rows and four columns in the cell setup zone 33 of the support substrate 21, the outer frame 23 is assembled, the rubber packing frame 24 having the same shape as the outer frame 23 is assembled on top of the outer frame 23, and the five plate spring members 22 are assembled.

Three plate spring members 22 among the five plate spring members 22 are assembled in the three inter-column spaces of the four columns of solar battery cells 10. One plate spring member 22 is assembled between the rightmost column of eight solar battery cells 10 and the inner surface of the outer frame 23. Another plate spring member 22 is assembled between the leftmost column of eight solar battery cells 10 and the inner surface of the outer frame 23. Eight solar battery cells 10 in each column are interposed between the connection flanges 22a of two adjacent plate spring members 22, whereby the connection flanges 22a are electrically connected to the corresponding positive or negative electrode 5 or 6. The front and rear ends in FIG. 8 of the plate spring members 22 are in contact with the corresponding front and rear electrode coatings 30a to 30c. Then, the light transmissible casing plate 25 is assembled thereon.

Figure 13:
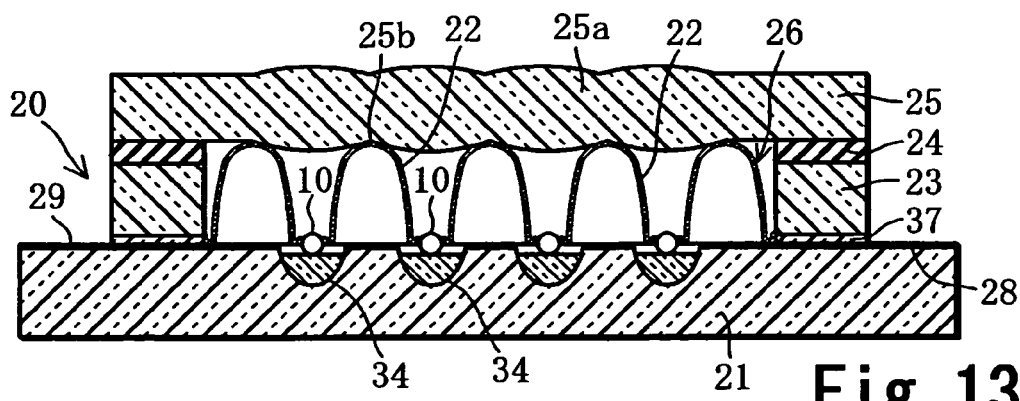
FIG. 13 is a cross-sectional view at the line XIII-XIII in FIG. 12.
Figure 14:
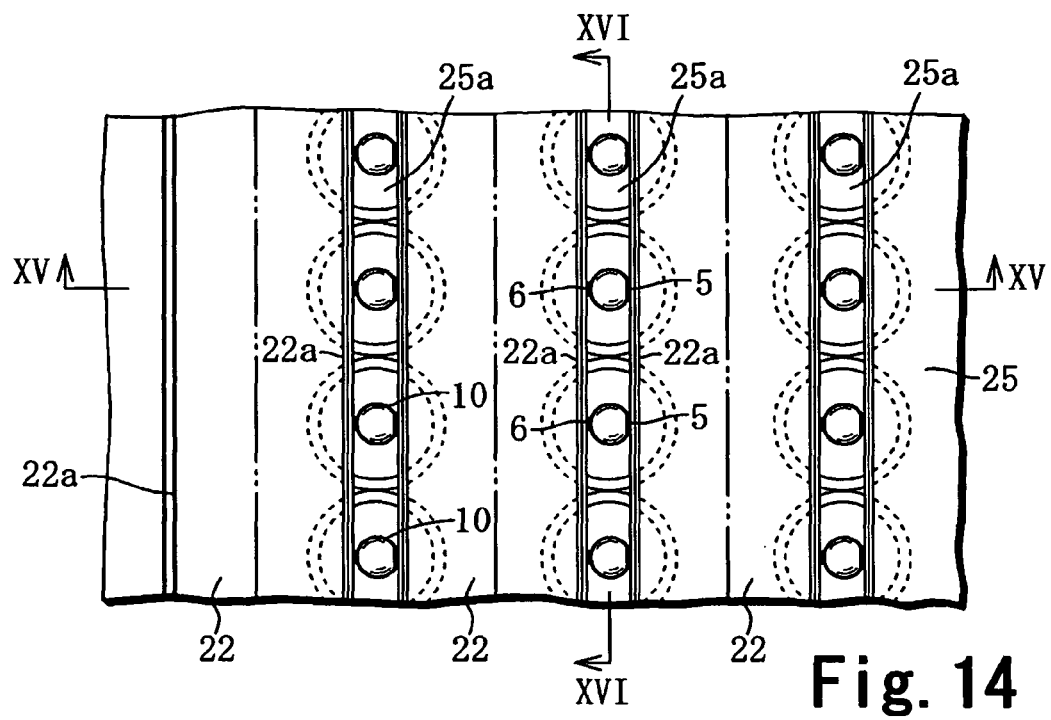
FIG. 14 is an enlarged plan view of the essential part of the solar battery module.
Figure 15:
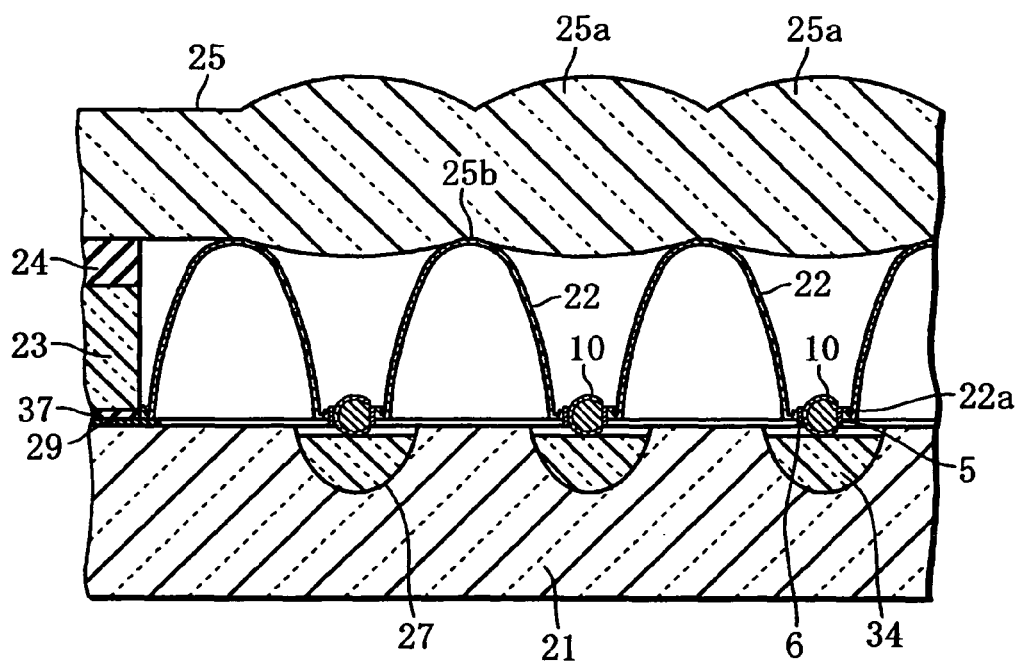
FIG. 15 is a cross-sectional view at the line XV-XV in FIG. 14.
Figure 16:
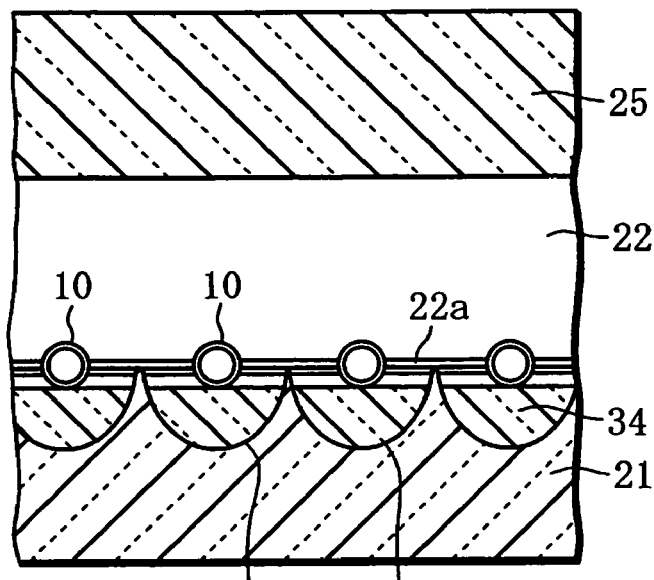
FIG. 16 is a cross-sectional view at the line XVI-XVI in FIG. 14.

As shown in FIGS. 13 and 15, the casing plate 25 is a colorless transparent white reinforced glass plate having a thickness of approximately 3 mm. In a plane view, the casing plate 25 has the same contour as the outer frame 23. The casing plate 25 has bolt holes (not shown) corresponding the bolt holes 31 and 38 in the four corners. The casing plate 25 has four rod-shaped convex lens parts 25a corresponding to the four columns of solar battery cells 10. The convex lens parts 25a guide light to the respective columns of solar battery cells 10. The casing plate 25 has concave engaging parts 25b engaging with the tops of the plate spring members 22 on the underside at the borders between the convex lens parts 25a.

Then, the support substrate 21, outer frame 23, rubber packing frame 24, and casing plate 25 are integrated by inserting bolts 39 in the bolt holes 31 and 38 in the four corners and fastening them to nuts (not shown) at the underside. Meanwhile, the plate spring members 22 receive a pressing force from the concave engaging parts 25b of the casing plate 25 via compressive deformation of the rubber packing frame 24. Therefore, the pairs of connection flanges 22a at the bottom of the plate spring members 22 shift away from each other while keeping contact with the top surface of the support substrate 21, electrode coatings 30a to 30c, positive electrode coating 28, and negative electrode coating 29. Consequently, the connection flanges 22a make tight contact with the positive or negative electrodes 5 or 6 of the solar battery cells 10 in each column, ensuring electrical connection.

Figure 18:
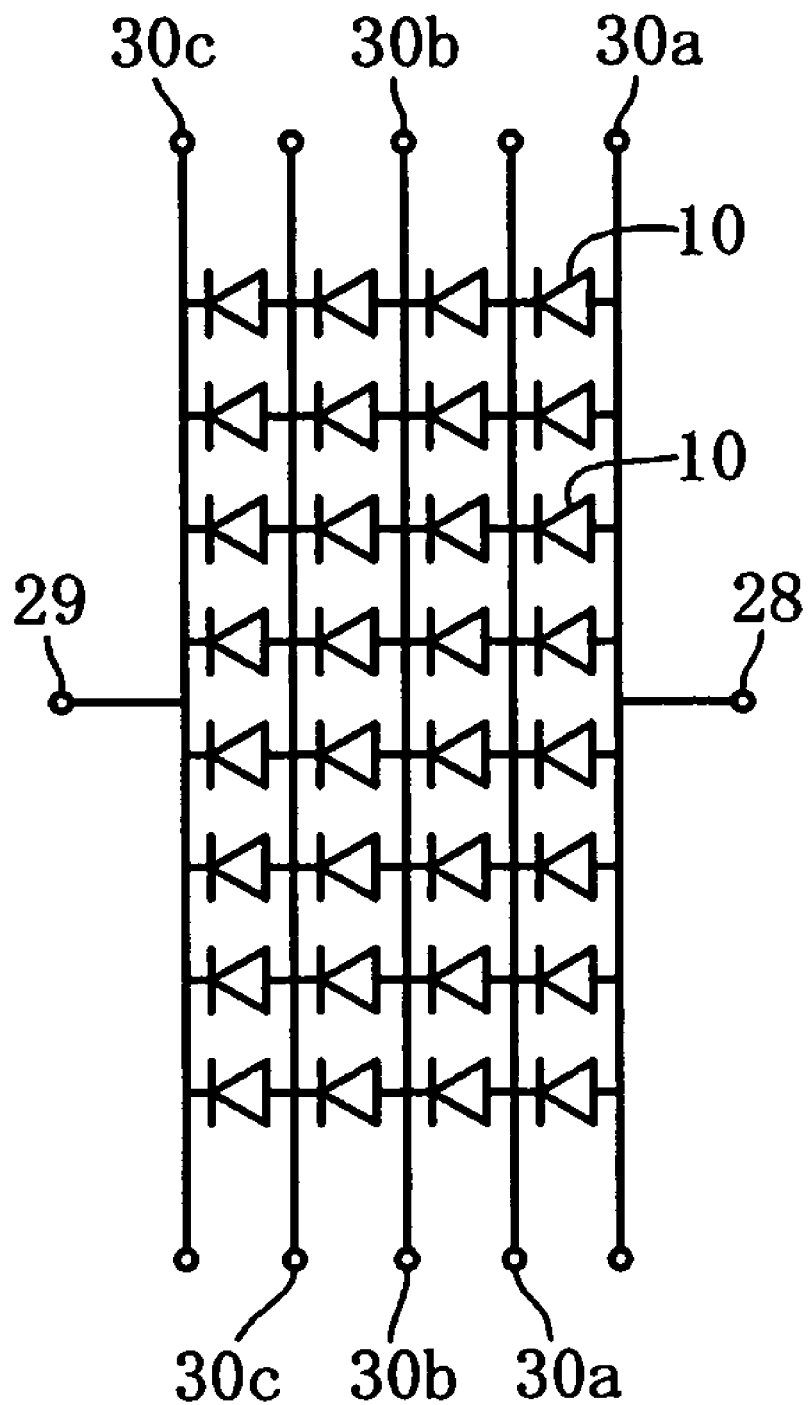
FIG. 18 is an equivalent circuit to the solar battery module.

FIG. 18 shows an equivalent circuit to the solar battery module 20 in which solar battery modules 10 in eight rows and four columns are connected in series and in parallel by a mesh-structure circuit. When some solar battery cells 10 are disabled because of failure, poor connection, or in shade, there is an alternative path bypassing the disabled solar battery cells 10, ensuring external retrieval of output from all not-disabled, normal solar battery cells. It is ensured that the solar battery module 20 is reliable.

Behavior of the solar battery module 20 will be described hereafter.

Figure 17:
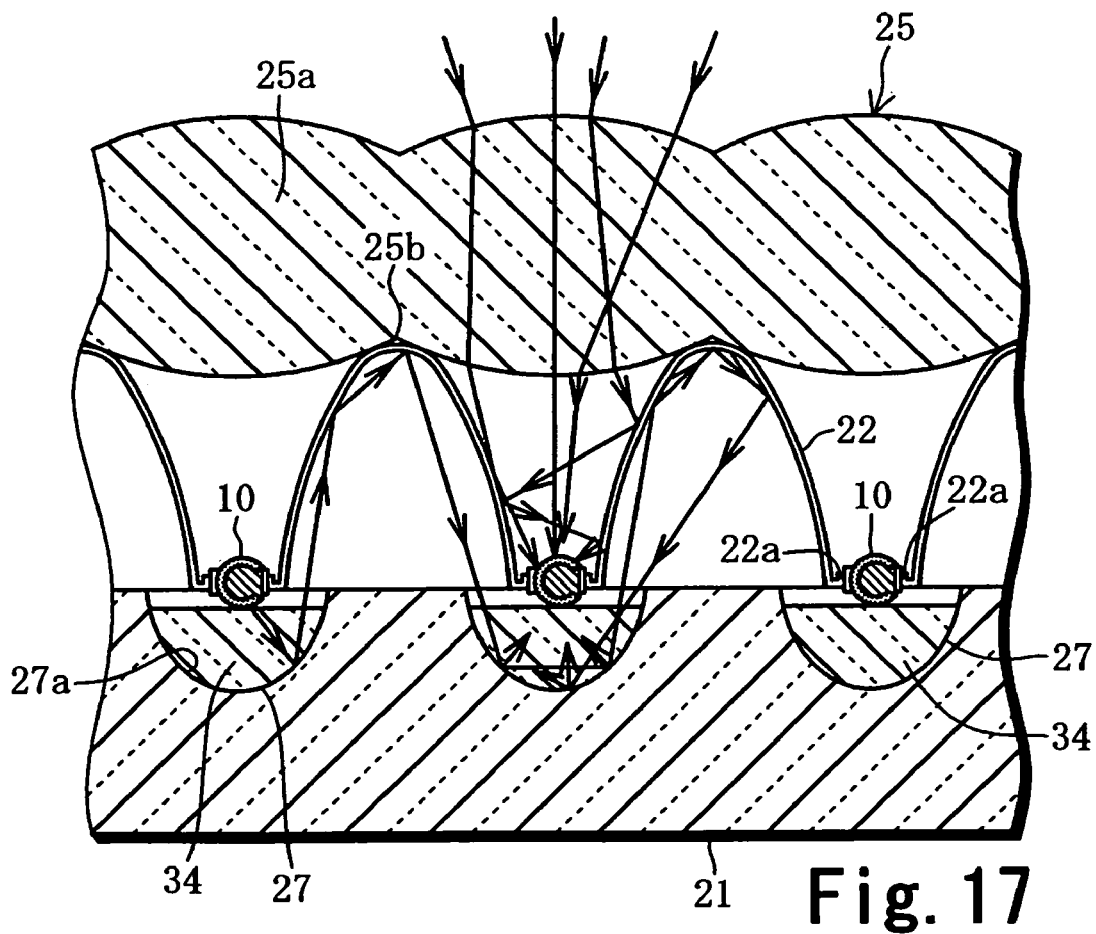
FIG. 17 is an enlarged view of a part of FIG. 15 for explaining behavior.

As shown in FIG. 17, light entering the casing plate 25 and convex lens parts 25a at a right angle is mainly collected by the convex lens parts 25a and reflected by the surfaces of the plate spring members 22, then entering the solar battery cells 10 for photoelectric conversion. Light passing between the solar battery cells 10 is diffusely reflected by the inner surfaces of the recesses 27, then entering the solar battery cells 10 for photoelectric conversion.

On the other hand, light entering the casing plate 25 and convex lens parts 25 in the centers of the convex lens parts 25a at a right angle enters the solar battery cells 10 for photoelectric conversion directly in most part and after diffusely reflected by the inner surfaces of the recesses 27 in part. Light transmitted through the casing plate 25 is reflected multiple times by the underside of the casing plate 25, outer and inner surfaces of the plate spring members 22, inner surfaces of the recesses 27, and surfaces of the solar battery cells 10 before it is absorbed by the solar battery cells 10 for photoelectric conversion. In this way, light is efficiently guided to the solar battery cells 10 in a closed space, ensuring increased efficiency and large output.

The casing plate 25 has the convex lens parts 25a each corresponding to a column of solar battery cells 10. Therefore, light entering the casing plate 25 obliquely is less reflected. Reduction in the output according to increase in the incident angle of light to the casing plate 25 becomes smaller. Furthermore, the plate spring members 22 have a large surface area for their volume, having a high heat dissipation capacity. Therefore, the temperature within the solar battery module 20 does not go up so much and the photoelectric conversion efficiency of the solar battery cells 10 does not go down so much, making the solar battery module 20 more durable.

The above described solar battery module 20 performs the following advantages.

For disposal of the solar battery module 20 after use, four bolts 39 are removed to disassemble the support substrate 21, outer frame 23, rubber packing frame 24, casing plate 25, multiple plate spring members 22, and multiple solar battery cells 10. Main components such as solar battery cells 10, plate spring members 22, and casing plate 25 can be reused or recycled. Repair of the solar battery module 20 can easily and efficiently be done through the same disassemble process.

No soldering is done with the solar battery module 20. No solder connection process is necessary, no soldering facility is required, and energy for soldering is saved. In addition, no thermal fatigue or deterioration at the connection due to soldering is observed.

In the solar battery module 20, light collection by the convex lens parts 25a and light reflection and guiding by multiple plate spring members 22 and multiple recesses 27 lead to increase in the amount of light entering the solar battery cells 10. Therefore, large output can be obtained using a small number of solar battery cells 10, significantly reducing production cost of the solar battery module 20. In a light emitting module in which light emitting diode elements are installed in place of the solar battery cells 10, light produced by the light emitting diode elements can efficiently be emitted outside in the same manner as above. In such a case, the recesses 27 serve to efficiently emit light outside.

The elastic members 34 filling the recesses 27 transmit light and are effective in positioning and holding the solar battery cells 10 during the assembly.

In the solar battery module 20, the internal space storing the solar battery cells 10 is hermetically sealed from the ambience by the support substrate 21, outer frame 23, rubber packing frame 24, coating 37, and casing plate 25. Therefore, deterioration of the solar battery cells 10 due to the ambient air is prevented and excellent heat and sound insulation is provided. The support substrate 21 is made of ceramic and the casing plate 25 is made of reinforced glass. The solar battery module 20 has an excellent mechanical strength and high heat and fire resistance. The solar battery module 20 has applications as a building material for walls and eaves.

The solar battery module 20 has the positive and negative electrode coatings 28 and 29 exposed on the outer surface and serial connection bolt holes 32a and 32b. Multiple solar battery modules 20 can be arranged in the transversal direction in FIG. 12 and easily serially connected via not shown conductive connection plates to increase output voltage. Similarly, the solar battery module 20 has the electrode coatings 30a to 30c exposed on the outer surface and parallel connection bolt holes 32d. Multiple solar battery modules 20 can be arranged in the longitudinal direction (column direction) in FIG. 12 and easily connected in parallel via not shown conductive connection plates to increase output current.

Furthermore, the solar battery module 20 has a conductive connection mechanism 26 connecting multiple solar battery cells 10 in series and in parallel in a mesh structure as shown in FIG. 18. When some solar battery cells 10 are disabled because of failure, poor connection, or in shade, there is an alternative path bypassing the disabled solar battery cells 10, ensuring external retrieval of output from all not-disabled, normal solar battery cells. It is ensured that the solar battery module 20 is reliable.

Partly modified embodiments of the above described solar battery module 30 will be described hereafter.

[1] The support substrate 21 can be constituted by any material easily molded and allowing for wiring such as polycarbonate (PC), PMMA, glass-cloth based epoxy resin, metal enamel, and insulating substrate. It is desirable that the support substrate 21 has a light reflecting coating covering the surface entirely or partly. The elastic members 34 filling the recesses 27 can be either polyvinyl butyral or ethylene vinyl acetate (EVA), which is transparent and adhesive.

Figure 19:
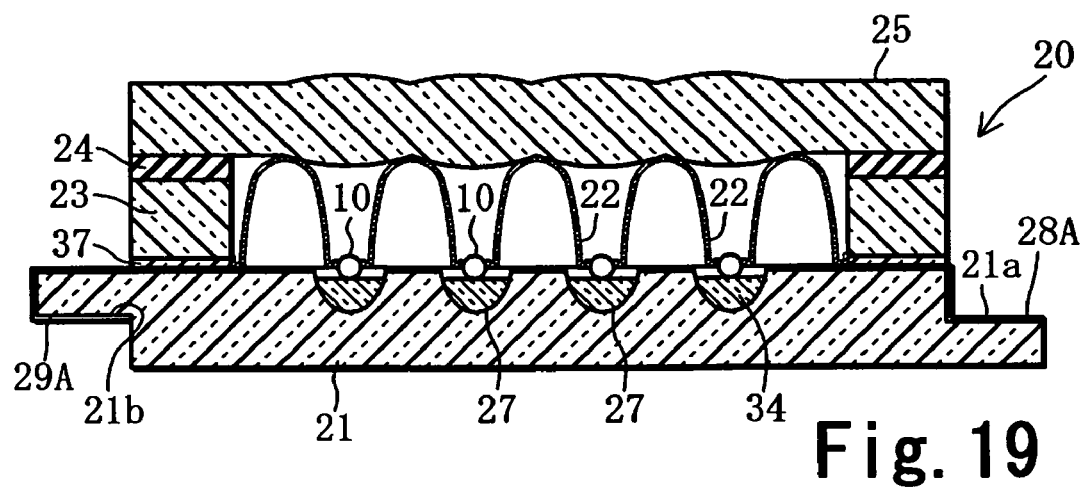
FIG. 19 is an illustration equivalent to FIG. 13 and showing the solar battery module according to an modified embodiment.

[2] For easily serially connecting multiple solar battery modules 20, for example, as shown in FIG. 19, the support substrate 21 of the solar batter module 20 can have at the right end a down step 21a having a positive electrode coating 28A extended over the top surface and at the left end an up step 21b formed by removing the lower half and having a negative electrode coating 29A extended over the underside.

Figure 12:
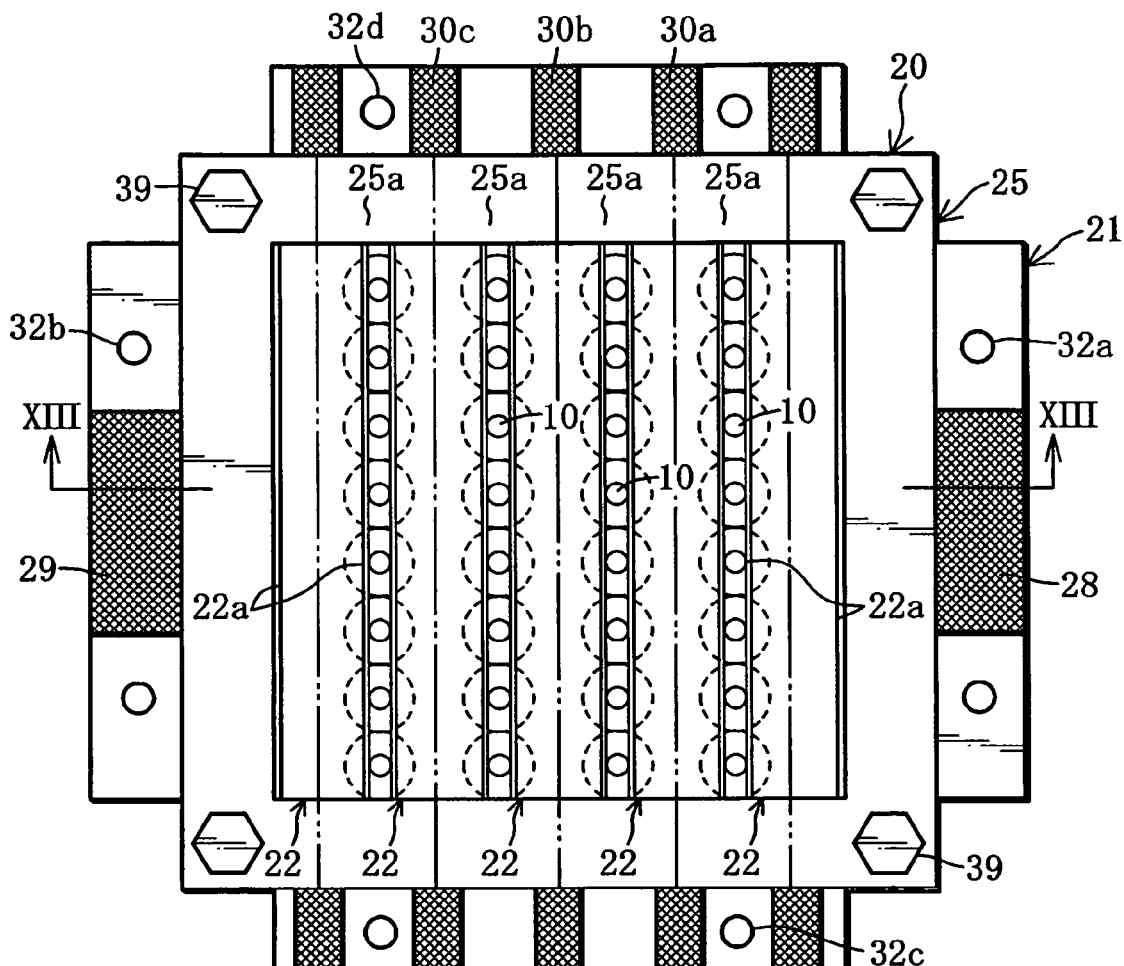
FIG. 12 is a plan view of the solar battery module.

When multiple solar battery modules 20 are arranged in the transversal direction in FIG. 12 and serially connected, the down step 21a of the solar battery module 20 is overlapped with the up step 21b at the left end of an adjacent solar battery module 20 on the right to make the positive and negative electrode coatings 28A and 29A contact with each other. Then, they are electrically serially connected by fastening bolts inserted in the series connection bolt holes 32a. Multiple solar battery modules 20 can be arranged in the longitudinal direction and connected in parallel the same manner as above.

[3] The light transmissible casing plate 25 can be constituted by a synthetic resin that is easy to mold, but not easily broken, such as polycarbonate, acryl, and silicone. The convex lens parts 25a are not essential. They can be omitted so that the casing plate 25 has a flat outer surface.

[4] The height of the plate spring members 22 can be reduced to one half or one third of the height of the shown plate spring members 22. The plate spring members 22 can be constituted by a known spring material such as carbon steel, phosphor bronze, tungsten steel, nickel steel, nickel silver, and stainless steel.

Figure 20:
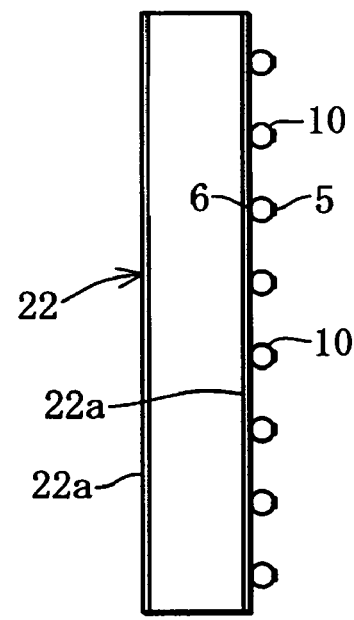
FIG. 20 is a plan view of a plate spring member to which multiple solar battery cells are fixed in advance in the solar battery module according to the modified embodiment.

[5] As shown in FIG. 20, one of the electrodes (for example the negative electrode in the figure) of multiple solar battery cells 10 can be fixed to one connection flange 22a of a plate spring member 22 by conductive adhesive or lead-free solder. Then, for assembling the solar battery module 20, the plate spring members 22 having the solar battery cells 19 are placed on the top surface of the support substrate 21. With this structure, the solar battery module 20 can significantly easily be assembled.

For disposal of the solar battery module 20 having the above structure, the plate spring members 22 and solar battery cells 10 can be retrieved in the state as shown in FIG. 20 and used as it is. When the solar battery cells 10 should be separated from the plate spring members 22, the parts fixed by conductive adhesive can easily be separated by a chemical solution and the parts fixed by solder can easily be separated by heating.

[6] The outer frame 23 can be made of glass-cloth based epoxy resin or polycarbonate. The rubber packing frame 24 can be made of silicone rubber or fluoro rubber.

[7] Solar battery cells or light emitting diode elements consisting of a spherical core having a thin semiconductor layer formed on the surface to create a pn-junction as set forth in the publication of WO99/10935 can be used in place of the above described spherical solar battery cells 10. The module in which multiple light emitting diode elements are installed in place of the above described multiple solar battery cells is a plane emission light emitting module.

[8] The above described embodiments are given by way of example. The present invention can be realized by a person of ordinary skill in the art by partially modifying the above described embodiments without departing from the scope of the present invention.

INDUSTRIAL APPLICABILITY

The light receiving or light emitting semiconductor module of the present invention is effectively used in solar battery panels or light emitting panels.

What is claimed is:
1. A light receiving or light emitting semiconductor module having light receiving or light emitting capability characterized by comprising:
   a support substrate;
   multiple granular semiconductor elements having light receiving or light emitting capability and arranged in multiple columns on said support substrate with their conducting direction aligned orthogonally to the column direction;
   multiple metal plate spring members in a form of nearly an inverted U-shaped cross-section trough having light reflection and conduction capabilities and provided in parallel in a manner that multiple semiconductor elements in each column are interposed between free ends of adjacent plate spring members; and
   a conductive connection mechanism connecting in parallel multiple semiconductor elements in each column via multiple plate spring members and serially connecting multiple semiconductor elements in multiple columns via multiple plate spring members.
2. The light receiving or light emitting semiconductor module according to claim 1 characterized in that:

an outer frame surrounding multiple semiconductor elements and multiple plate spring members along an outer periphery is provided on the support substrate;

a light transmissible casing plate covering said multiple semiconductor elements, multiple plate spring members and the outer frame on a top side and detachably fixed to the support substrate and the outer frame is provided; and said casing plate presses tops of multiple plate spring members to ensure an electric connection of multiple contact parts of said conductive connection mechanism.

3. The light receiving or light emitting semiconductor module according to claim 1 or 2 characterized in that each of said semiconductor elements is spherical and has positive and negative electrodes formed in positive and negative poles at opposite positions about a center of the semiconductor element, and the positive and negative electrodes make contact with free ends of said plate spring members.

4. The light receiving or light emitting semiconductor module according to claim 1 or 2 characterized in that said casing plate has multiple rod-shaped convex lens parts corresponding to multiple columns and integrally formed on an upper surface there of.

5. The light receiving or light emitting semiconductor module according to claim 1 or 2 characterized in that said support substrate has multiple nearly semispherical recesses situated below multiple semiconductor elements, said recesses are each filled with a light transmissible elastic member, and said semiconductor elements are provided respectively on surfaces of said elastic members.

6. The light receiving or light emitting semiconductor module according to claim 2 characterized in that a rubber packing frame is provided between said casing plate and said outer frame in a compressed manner.

7. The light receiving or light emitting semiconductor module according to claim 1 or 2 characterized in that a positive electrode coating and a negative electrode coating serving as positive and negative electrodes of said semiconductor module are provided on a top surface of an outer periphery of said support substrate and protrude outside said outer frame.

8. The light receiving or light emitting semiconductor module according to claim 1 or 2 characterized in that multiple electrode coatings electrically connected to multiple plate spring members, respectively, are provided on a top surface of an outer periphery of said support substrate and protrude outside either end of said outer frame in a column direction.

9. The light receiving or light emitting semiconductor module according to claim 2 characterized in that said plate spring members have at a pair of free bottom ends contact flanges for making contact with the positive or negative electrodes of the semiconductor elements.

10. The light receiving or light emitting semiconductor module according to claim 1 or 2 characterized in that said casing plate has on an inner surface multiple concave engaging parts abutting against tops of multiple plate spring members, respectively.

11. The light receiving or light emitting semiconductor module according to claim 3 characterized in that the positive or negative electrodes of the semiconductor elements in each column are fixed to a free end of the plate spring member in an electrically connected state in advance and such plate spring members with semiconductor elements are incorporated in assembling said light receiving or light emitting semiconductor module.

12. The light receiving or light emitting semiconductor module according to claim 1 or 2 characterized in that said semiconductor module is a solar battery module.

13. The light receiving or light emitting semiconductor module according to claim 1 or 2 characterized in that said semiconductor module is a light emitting diode module.

* * * * *